(12) United States Patent
Ohuchi (10) Patent No.: US 6,544,883 B2
(45) Date of Patent: Apr. 8, 2003

(54) METHOD OF MANUFACTURING SEMICONDUCTOR DEVICE

(75) Inventor: Masahiko Ohuchi, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/987,029

(22) Filed: Nov. 13, 2001

(65) Prior Publication Data

US 2002/0058371 A1 May 16, 2002

(30) Foreign Application Priority Data

Nov. 14, 2000 (JP) ........................................ 2000-347078

(51) Int. Cl.⁷ .......................................... H01L 21/4763
(52) U.S. Cl. ........................ 438/624; 438/637; 438/639
(58) Field of Search ................. 438/637, 639, 438/620, 624

(56) References Cited

U.S. PATENT DOCUMENTS

| | | | | |
|---|---|---|---|---|
| 5,500,080 A | * | 3/1996 | Choi | 156/644.1 |
| 5,719,089 A | * | 2/1998 | Cherng et al. | 438/637 |
| 6,187,669 B1 | * | 2/2001 | Chiou et al. | 438/637 |
| 6,281,109 B1 | * | 8/2001 | Ma et al. | 438/618 |
| 6,316,352 B1 | * | 11/2001 | Wu et al. | 438/639 |

* cited by examiner

Primary Examiner—T. N. Quach
(74) Attorney, Agent, or Firm—McGinn & Gibb, PLLC (57) ABSTRACT

The method of manufacturing a semiconductor device according to the present invention has a step of forming a first layer-insulating film to be adhered to a diffused layer formed on the surface of a semiconductor substrate or to a lower wiring formed on the semiconductor substrate, using a first dielectric, a step of disposing mutually parallel upper wirings on the first layer-insulating film and forming a protective film composed of a second dielectric having an etching rate smaller than that of the first dielectric on the top face and side faces of the upper wirings, and a step of forming a contact hole penetrating the first layer-insulating film and reaching the diffused layer or the lower wiring by a dry etching that uses the protective insulating film as a part of an etching mask.

20 Claims, 7 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly to a method of manufacturing a contact hole which penetrates the area between semiconductor wirings of a semiconductor device.

2. Description of the Prior Art

The trend of rendering semiconductor devices more refined and higher density is still being pushed vigorously, and at present development and trial manufacture of semiconductor devices of ultrahigh degree of integration such as logic devices designed with dimensional reference of about 0.15 µm and memory devices using one giga bit dynamic random access memories (Gb DRAMs) are under development. As for the memory devices, products of 256 Mb DRAMs that are reduced version based on the above design reference are about to be put to practical use. However, accompanying such a refinement of the semiconductor devices, formation method of contact holes that is indispensable for semiconductor element structure is becoming extremely difficult.

Normally, in the manufacture of a semiconductor device, a semiconductor element with fine structure is formed by sequentially laminating on a semiconductor substrate, patterns of metal films, semiconductor films, insulator films, and the like formed of various kinds of material. In laminating patterns for the semiconductor element, it is necessary to align a mask with a lower layer pattern that is formed in the previous process in order to form the next upper layer pattern. Similar situation arises also in the formation of a fine contact hole. For example, in a structure where diffused layers are formed on the surface of a silicon substrate and a multilayer wiring is formed on its upper layer, there arises a need for forming contact holes that pass between first layer wirings that are arranged with a prescribed pitch and reach specified regions of the diffused layers in order to connect electrically second layer wirings to the diffused layers. In the following, such a case will be described by reference to FIG. 7.

FIG. 7 shows sectional views arranged in the order of the manufacturing processes for schematically describing the manufacture of a contact hole of a semiconductor device according to the conventional technique.

Figure 7A:
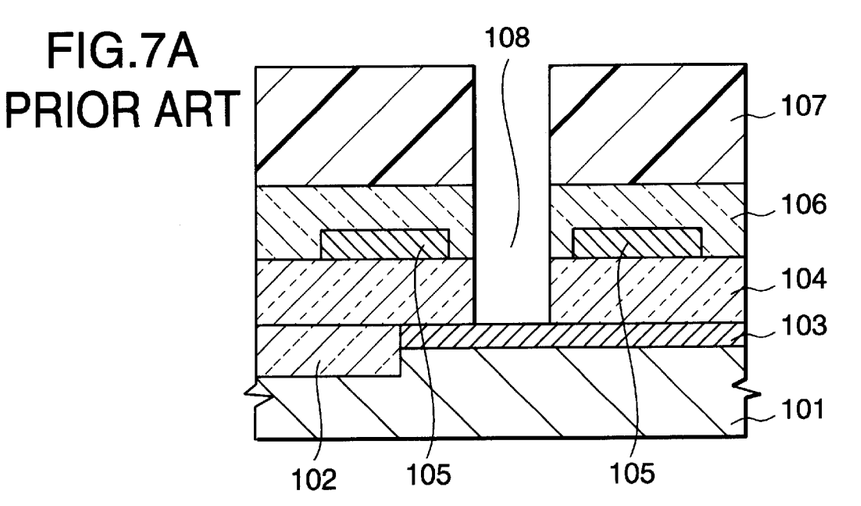
FIGS. 7A and 7B are sectional views arranged in the order of formation processes of a contact hole for describing the conventional technique.

As shown in FIG. 7A, a trench element isolation region 102 is formed selectively in a specified region of a silicon substrate 101. Here, the trench element isolation region 102 is formed by the known shallow trench isolation (STI) method.

Next, a diffused layer 103 is formed by an ion implantation and a heat treatment. Then, a first layer-insulating film 104 is formed by deposition of a silicon oxide film by chemical vapor deposition (CVD) method and flattening of the silicon oxide film by a subsequent chemical mechanical polishing (CMP).

Next, first wirings 105 of high melting point metal material are formed with a prescribed spacing. Then, a second layer-insulating film 106 is formed so as to cover the first wirings 105 and the first layer-insulating film 104. The second layer-insulating film 106 is made of silicon oxide similar to the first layer-insulating film 104.

After that, a resist mask 107 is formed by the known photolithography process. Then, a contact hole 108 is formed at a prescribed region of the diffused layer 103 by reactive ion etching (RIE) of the second layer-insulating film 106 and the first layer-insulating film 104 using the resist mask 107 as an etching mask. Here, since the contact hole 108 is formed in the space between parallel first wirings 105, when the separation distance between the wirings gets small, the dimension of the contact hole is reduced accordingly.

Now, in a peripheral circuit part of a semiconductor device such as an application specific IC (ASIC), it becomes also particularly important to dispose, in high density, wirings that are formed on the upper layer of an active element like a MOS transistor. For this reason, when the reference of design dimension of the semiconductor device becomes about 0.15 µm, the pitch of the first wirings formed of a high melting point metal such as tungsten is designed to be about 0.5 µm, approaching the limit of the fine processing. In this case, the line width of the first wirings 105 is 0.15 µm and the space between the wirings is 0.35 µm. The size of the contact hole is about 0.15 µm. Here, the margin for the mask alignment in the photolithography process becomes about 0.1 µm.

Figure 7B:
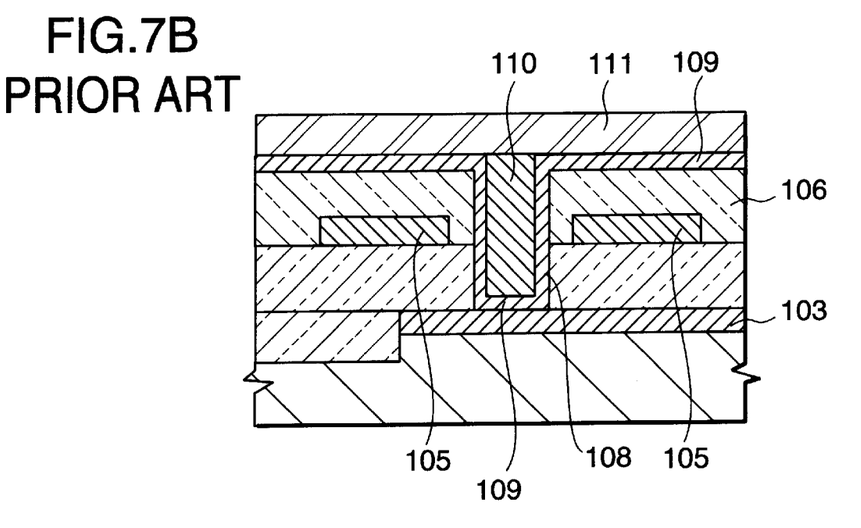

Next, as shown in FIG. 7B, a barrier metal layer 109, comprising a titanium silicide layer formed only on the surface of the diffused layer 103, and a titanium nitride layer that covers the inner wall of the contact hole 108 and the top of the second layer-insulating film 106, is formed in a specified region of the diffused layer 103 that has the contact hole 108 formed above it.

Next, a contact plug 110 comprising normally of tungsten is buried on the barrier metal layer 109 formed in the contact hole part 108. Tungsten here is deposited by CVD and is then formed by being buried in the contact hole 110 by CMP.

Next, a second wiring 111 to be adhered to the barrier metal layer 109 and the contact plug 110 is formed.

In this way, a portion of the semiconductor device having the first wirings 105 and the second wiring 111, and having a dimension of the contact hole 108 for connecting the diffused layer 103 and the second wiring 111 that is constrained by the space between the first wiring 105, is formed.

Moreover, although not shown, a memory device such as a DRAM has a structure in which a lower electrode of a capacitor constituting a memory cell is connected to a diffused layer via a contact hole provided between parallel word lines or parallel bit lines. In this case, the parallel word lines or parallel bit lines correspond to the first wirings 105 and the lower electrode corresponds to the second wiring 111 in FIG. 7.

As described above, a photolithography process is required in order to open a contact hole of the semiconductor device. In the photolithography process, it is indispensable to align a mask with the lower layer pattern formed in the preprocess, namely, the first wiring pattern. For this reason, in the conventional formation of a contact hole, it is necessary to secure a marginal region for aligning a mask in the arrangement of the semiconductor device. The marginal region required for aligning the mask becomes a significant hindrance factor to the enhancement of the arrangement density of the semiconductor element, forming a large bottleneck toward higher integration or higher density of the semiconductor device.

The effect of the marginal region on higher integration or higher density of the semiconductor device is the more significant as the dimensional reference of the semiconductor device is the smaller. In particular, in a memory device such as a DRAM the effect of the marginal region is conspicuous because there is involved a large number of contact holes.

BRIEF SUMMARY OF THE INVENTION

Objects of the Invention

It is an object of the present invention to provide a method which resolves the problems described in the above and enables to form contact holes in self-alignment with wirings in a semiconductor device having a multilayer wiring. Moreover, it is another object of the present invention to facilitate the formation and enhance the reliability of the self-aligned contact holes in order to apply the method to mass production of the semiconductor device.

Summary of the Invention

The method of manufacturing a semiconductor device according to the present invention includes a step of forming a first layer-insulating film of a first dielectric to be adhered to a diffused layer formed on the surface of a semiconductor substrate or to a lower wiring formed on the semiconductor substrate, a step of disposing mutually parallel upper wirings on the first layer-insulating film and forming a protective insulating film of second dielectric with etching rate smaller than that of the first dielectric on the top face and the side faces of the upper wirings, and forming a contact hole reaching the diffused layer or the lower wiring by penetrating the first layer-insulating film by means of a dry etching that uses the protective insulating film as a part of an etching mask.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1A:
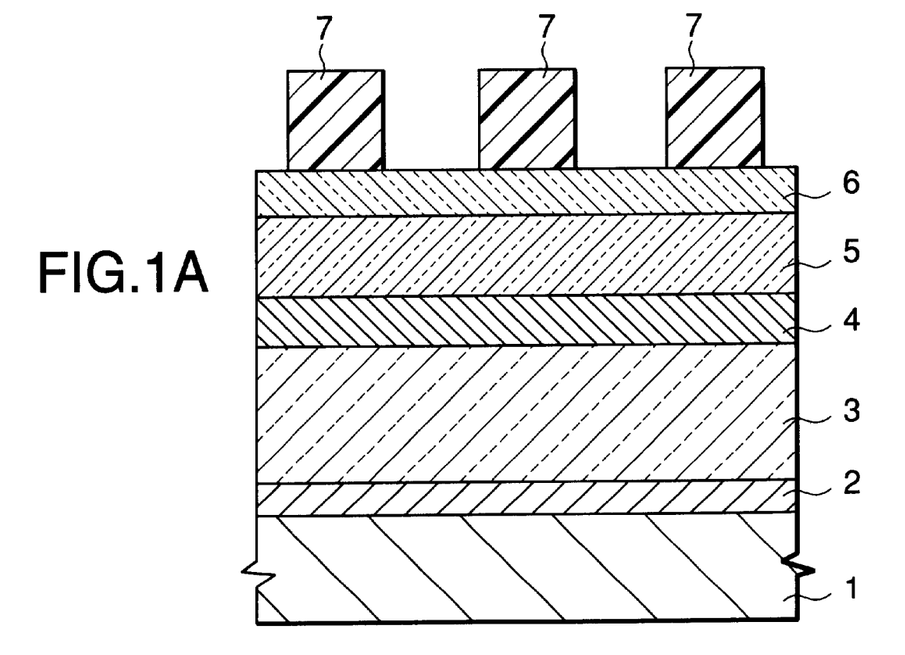
FIGS. 1A and 1B are sectional views arranged in the order of the formation processes of a contact hole for describing a first embodiment of this invention.

Referring to FIG. 1 to FIG. 4, a first embodiment of the present invention will be described. FIG. 1 to FIG. 3 are sectional views arranged in the order of manufacture of a self-aligned contact hole according to this invention, and FIG. 4 is a sectional view of the self-aligned contact hole after the manufacturing processes.

As shown in FIG. 1, a diffused layer 2 of N-type conductivity is formed on the surface of a silicon substrate 1 of P-type conductivity by ion implantation of an impurity and a heat treatment. Then, a first layer-insulating film 3 of thickness of about 500 nm is formed. The first layer-insulating film 3 is formed by deposition of a silicon oxide film using known CVD method and a subsequent flattening of the silicon oxide film by CMP.

Next, a metal film 4 is formed on the flattened first layer-insulating film 3. The metal film 4 is composed of a tungsten (W) film or a laminated film of W and tungsten nitride (WN) film, of thickness of about 50 nm deposited by CVD or sputtering.

Next, a protective nitride film 5 is formed on the metal film 4 by thermal CVD. Here, the protective nitride film 5 is a film with thickness of about 200 nm of silicon nitride which is a second dielectric. The film formation temperature of the thermal CVD is in the range of 750 to 800° C., and the reaction gas for the film formation is a mixed gas of silane ($SiH_4$) and ammonia ($NH_3$). Then, a protective oxide film 6 composed of a silicon oxide film with thickness of 50 nm deposited by plasma CVD is formed so as to cover the protective nitride film 5.

Following that, a resist mask 7 for wiring pattern is formed on the protective oxide film 6 using known photolithography technique. Then, the protective oxide film 6 and the protective nitride film 5 are subjected to RIE using the resist mask 7 as an etching mask. Here, the etching gas is a plasma excited mixed gas of $CF_4$ and helium, where a fluorocarbon gas such as $CH_2F_2$, $CHF_3$, $C_4F_8$ or $CH_3F$ may be used in place of $CF_4$ gas.

Figure 1B:
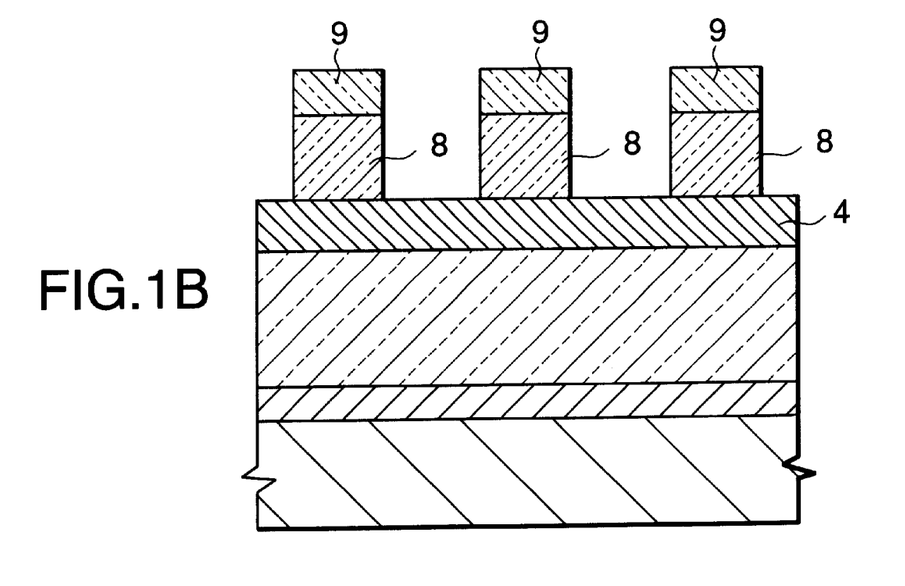

In this way, a nitride film mask 8 and an oxide film mask 9 for the wiring pattern on the metal film 4 are formed as shown in FIG. 1B. The pattern width and the pattern space of the nitride film mask 8 and the oxide film mask 9 are both 0.2 $\mu$m.

Figure 2A:
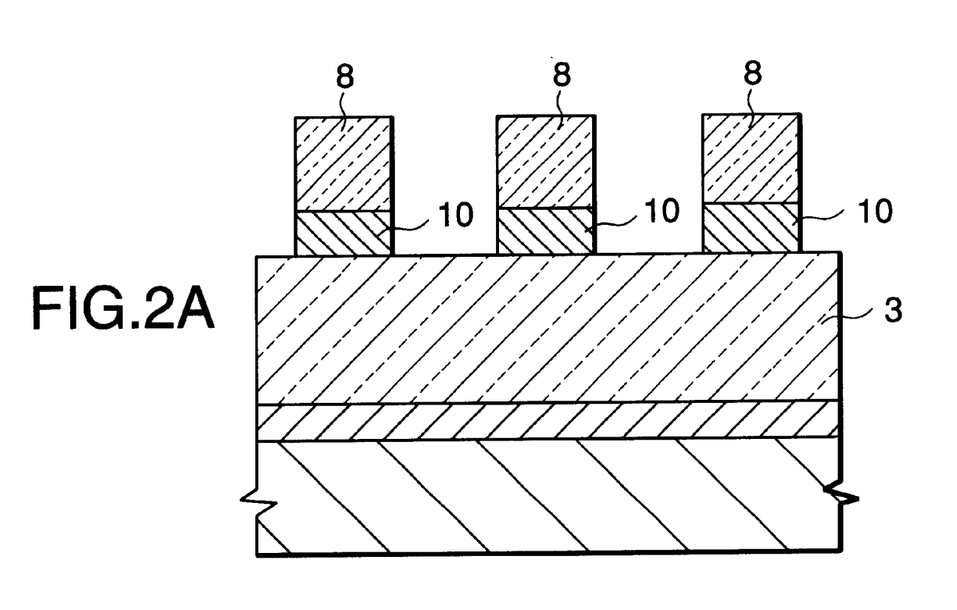
FIGS. 2A and 2B are sectional views arranged in the order of formation processes of the contact hole in continuation with the processes in FIG. 1.

Next, after removal of the resist mask 7, the metal film 4 is dry etched by a plasma etching system that employs inductively coupled plasma (ICP) or microwave excitation (ECR) which uses the laminated oxide film mask 9 and the nitride film mask 8 as an etching mask. For the dry etching, a gas obtained by adding $CF_4$ gas or $C_4F_8$ gas to the mixed gas of $SF_6$, $N_2$ and $Cl_2$ is used as the reaction gas. When this reaction gas is used, the ratio of the etching rate of the silicon oxide film to that of tungsten is about 1 to 2, namely, the selectivity ratio of etching of the oxide film mask 9 to the metal film 4 is 1 to 2. Moreover, the ratio of the etching rate of the silicon nitride film to that of tungsten is about 1/5, namely, the selectivity ratio of etching of the nitride film mask 8 and the metal film 4 is less than 0.2. What is important here is not to leave the oxide film mask 9 after the dry etching of the metal film 4, and not to allow the etching of the nitride film mask 8. The reason for this will be described later. In this manner, first wiring 10 and the nitride film mask 8 with both of line width and line space being 0.2 $\mu$m are formed on the first layer-insulating film 3 as shown in FIG. 2A.

Next, the sample is subjected to known oxygen plasma treatment (ashing), and is then subjected to a treatment in a diluted hydrofluoric acid solution. Here, the diluted hydrofluoric acid solution (referred to as DHF hereinafter) is obtained by diluting hydrofluoric acid liquid of concentration of 49% with pure water in volume ratio of 1 to 100. Materials attached to the metal film 4 during the dry etching are removed by dipping the sample in the DHF for 10 seconds. Here, the DHF may be added with ammonium fluoride solution.

Figure 2B:
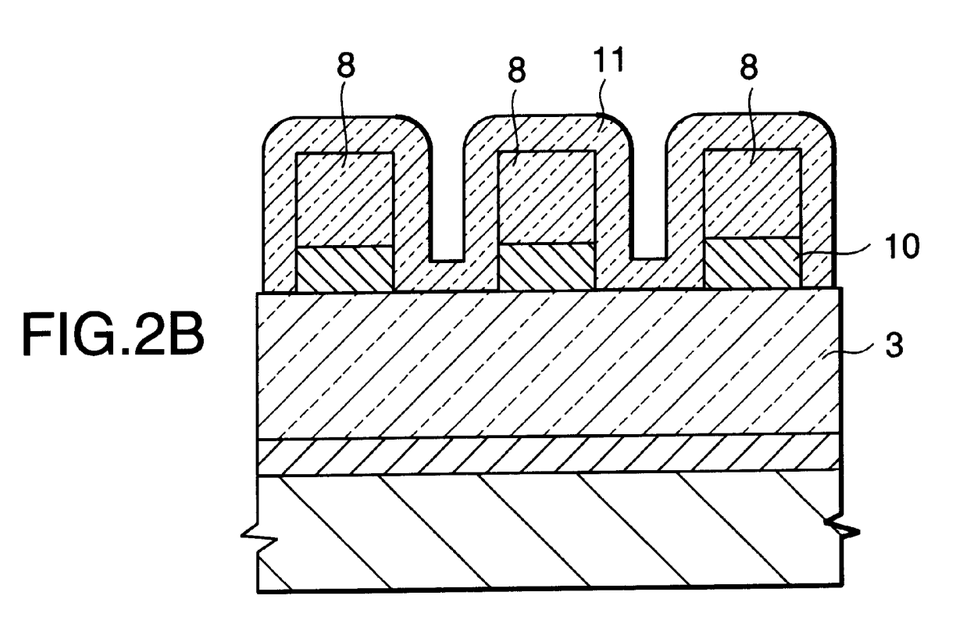

Next, a blanket nitride film 11 with thickness of about 70 nm is formed on the entire surface through the formation of a silicon nitride film by thermal CVD as shown in FIG. 2B. The blanket nitride film 11 serves as a film of second dielectric. In the thermal CVD, film formation temperature is in the range of 750 to 800° C., an the reaction gas for film formation is a mixed gas of $SiH_4$ and $NH_3$. In this CVD, it is preferable to increase the flow rate of $SiH_4$ gas relative to the flow rate of $NH_3$ gas. In other words, the ratio of flow rate of $NH_3$ gas/flow rate of $SiH_4$ gas is set large to be about 100. By so doing, the blanket nitride film 11 can be made to adhere conformally to the first wirings 10 and the nitride film masks 8 that are patterned, and the first layer-insulating film 3. Here, when a condition of the CVD, for example, the total pressure of the reaction gas is increased to about $4\times10^4$ Pa which is ¼ to ½ of the normal pressure, the step coverage of the nitride film is enhanced. Then, the thickness of the blanket nitride film 11 on the surface of the first layer-insulating film 3 between the wirings and that on the top surface and on the side faces of the first wiring 10 and the nitride film mask 8 have almost the same value.

Figure 3A:
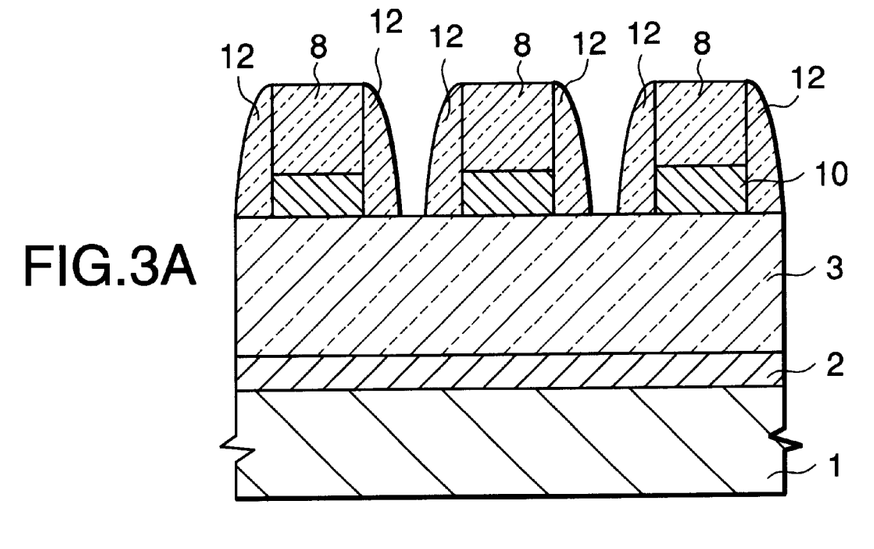
FIGS. 3A and 3B are sectional views arranged in the order of formation processes of the contact hole in continuation with the processes in FIG. 2.

Next, the sample is subjected to an etching of the entire surface, namely, to an etch-back of the entire surface of the blanket nitride film 11. In this way, a sidewall nitride film 12 with thickness of about 50 nm is formed on the sidewall of the first wirings 10 and the nitride film mask 8 as shown in FIG. 3A. In this process a plasma excited mixed gas of $NF_3$ and $N_2$ is used as the reaction gas. Use of such an etching gas makes the ratio of the etching rate of the silicon oxide film to that of the silicon nitride film small, so that there occurs hardly any etching of the surface of the first layer-insulating film 3 in the etch-back process. The sidewall nitride film 12 forms a protective insulating film for both of the first wiring 10 and the nitride film mask 8.

Next, after subjecting the sample to the known oxygen plasma treatment, it is subjected to the DHF treatment in the above. By dipping the sample into the DHF for 10 seconds, attached materials such as organic polymers attached to the surface of the nitride film mask 8, the surface of the sidewall nitride film 12 and the surface of the first layer-insulating film during the etch-back process are removed.

Next. second layer-insulating film 13 with thickness of about 500 nm is formed. The second layer-insulating film 13 is formed by deposition of a silicon oxide film by CVD and a subsequent flattening of the silicon oxide film by CMP. Then, a resist mask 14 with a contact hole pattern is formed by known photolithography technique, and the second layer-insulating film 13 and the first layer-insulating film 3 are dry etched sequentially using the resist mask 14 as an etching mask. In this manner, contact holes 15 that penetrate between the mutually adjacent first wirings 10 and reach the surface of the diffused layer 2 are formed as shown n FIG. 3B. Here, the sidewall nitride film 12 and the nitride film mask 8 protect the first wirings from being etched.

Figure 3B:
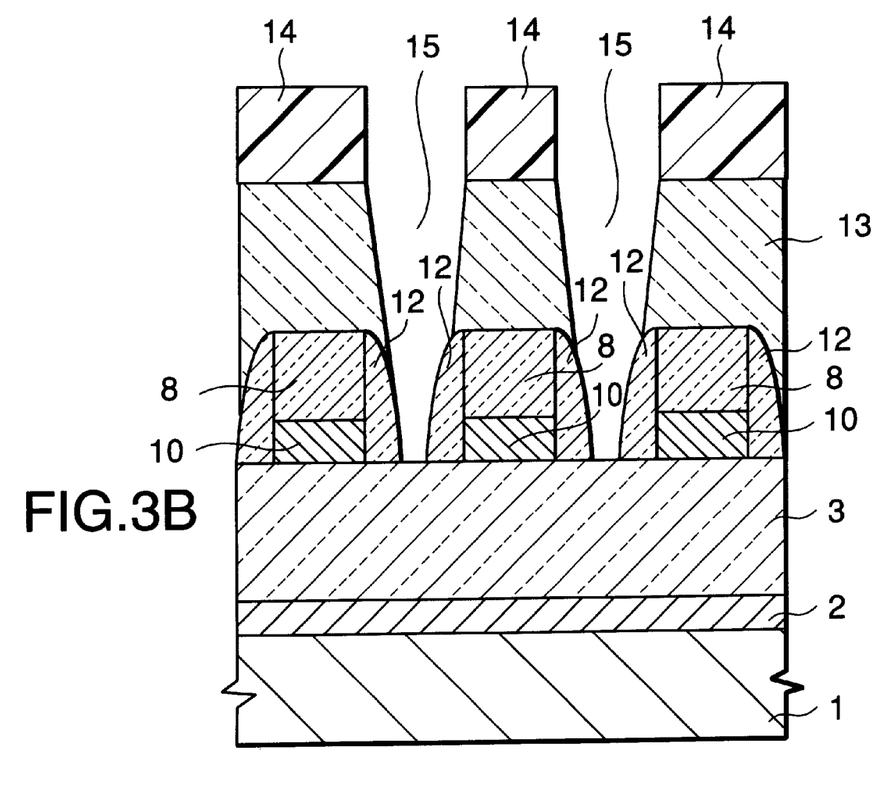

The dry etching for forming the contact holes 15 is performed by using an RIE that employs two radio frequencies selected from the RF range of 13.56 to 60 MHz for plasma excitation, to which is added an RF of around 1 MHz. In such an RIE with two frequencies, a plasma excited mixed gas of $C_4F_8$, $O_2$ and argon (Ar) is used as the reaction gas. By the use of such an etching gas, the ratio of the etching rate of the silicon oxide film to that of the silicon nitride film can be made large, so that etching of the sidewall nitride film 12 or the nitride film mask 8 hardly takes place in the RIE process. Moreover, the sidewall nitride film 12 functions also as an etching mask for the first layer-insulating film 3 in the RIE process for the formation of the contact holes 15.

Next, after removal of the resist mask 14 by an ashing using oxygen plasma, the sample is subjected to a treatment using the DHF. In this treatment, fluorine containing organic polymers or heavy metal contaminants generated in the formation of the contact holes 15 are removed by dipping the sample in the DHF for 10 seconds.

In the subsequent processes, although not shown, a contact plug is charged into the contact holes 15 and second wirings that are connected to the contact plugs are formed in a manner similar to that described in connection with the conventional technique.

As was described in connection with FIG. 2A, by arranging not to leave the oxide film mask 9 after the dry etching of the metal layer 4 and not to allow the progress of etching of the nitride film mask 8, it is possible to let the sidewall nitride film 12 described in FIG. 3A form an etching protective film with the nitride film mask on the first wiring 10.

In the present invention, the nitride film mask 8 and the sidewall nitride film 12 formed around the first wiring 10 is used as an etching mask in the RIE for the formation of the contact hole. Because of this, it is possible to form the contact hole in the first layer-insulating film 3 in self-alignment with the first wiring 10.

In this way, the alignment margin in the photolithography process required in the conventional technique can be made unnecessary, and it becomes possible to enhance the surface density of the semiconductor element, and enhance the degree of integration of the semiconductor device to a large extent.

Figure 4A:
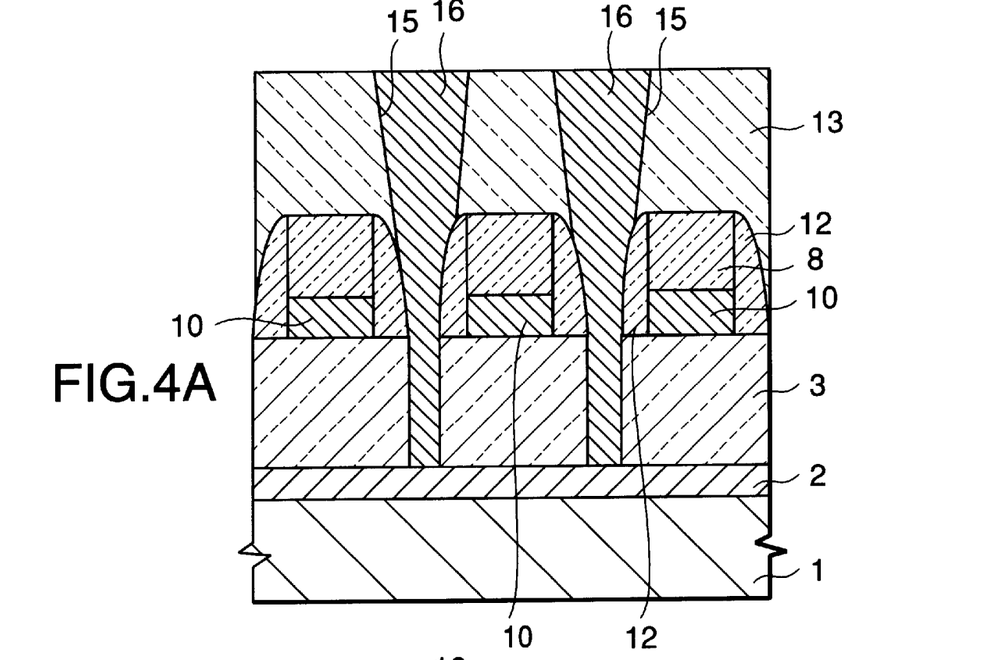
FIGS. 4A and 4B are sectional views of the contact hole part for describing the effect due to the formation of the contact hole of this invention.
Figure 4B:
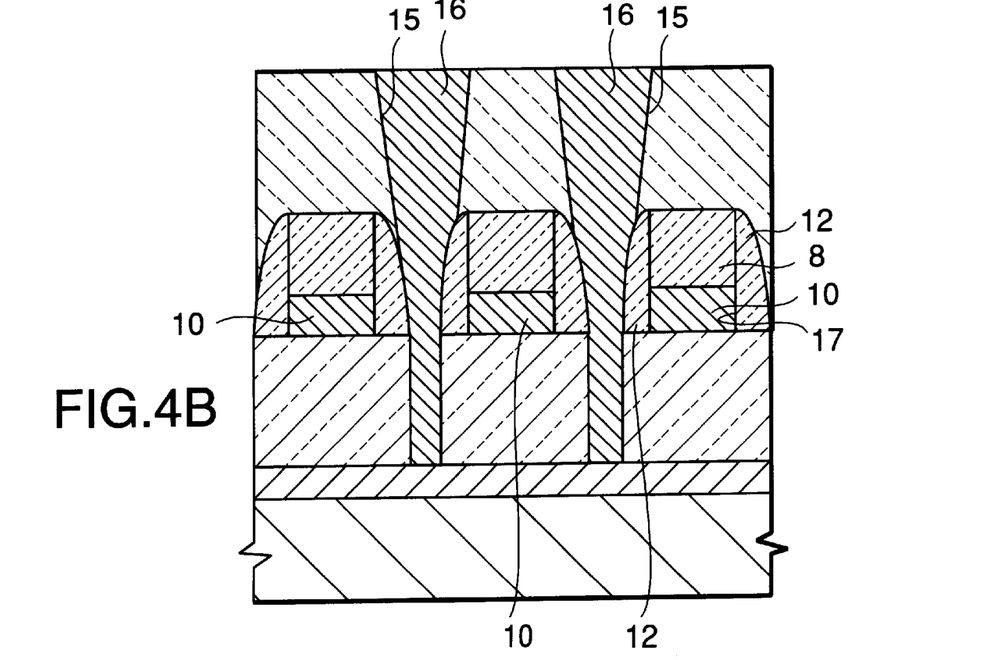

Moreover, it is a feature of this invention to subject the sample to a DHF treatment after the RIE treatment as mentioned in the above. The effect of this treatment will be described by reference to FIG. 4. FIG. 4 gives sectional views after filling contact plugs 16 into the contact holes 15 following the process described in connection with FIG. 3. FIG. 4A illustrates the case of removal method using the DHF according to the present invention, and FIG. 4B illustrates the case of using the removal method according to the conventional technique. In the conventional removal method, the treatment following the RIE is carried out in either one of a mixed solution of aqueous solution of ammonia, hydrogen peroxide solution and pure water (referred to as APM hereinafter), a mixed solution of sulfuric acid, hydrogen peroxide solution and pure water (referred to as SPM hereinafter) or a mixed solution of hydrochloric acid, hydrogen peroxide solution and pure water (referred to as HPM hereinafter).

When the contact holes 15 are formed in self-alignment with the first wirings 10 covered with the nitride film mask 8 and the sidewall nitride film 12 as described in FIG. 3B, then the sample is subjected to the DHF treatment, there arises absolutely no dissipation, that will be described later, in the first wirings 10 made of tungsten or the like as shown in FIG. 4A. In this invention, the contact plugs 16 are filled into the contact holes 15 after the DHF treatment.

In contrast, when the contact holes 15 are formed in self-alignment with the first wirings 10 covered with the nitride film mask 8 and the sidewall nitride film 12, then the sample is subjected to a treatment with APM, SPM or HPM in the above, dissipated parts 17 appear without control in parts of the first wirings 10 as shown in FIG. 4B. The cause of dissipation of parts of the wirings composed of a high melting point metal such as tungsten is not clarified yet.

Figure 5:
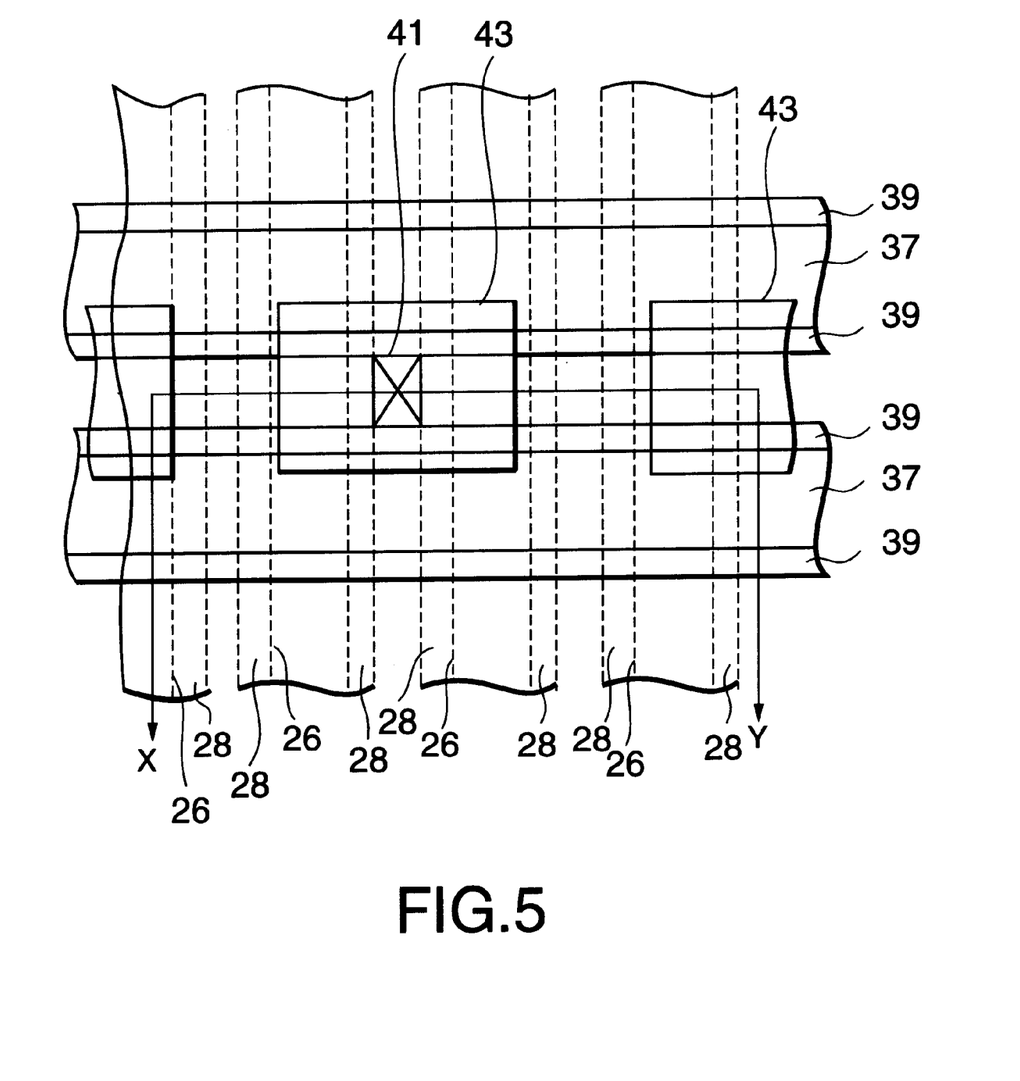
FIG. 5 is a plan view of the memory cell part for describing a second embodiment of the invention.

Next, referring to FIGS. 5 and 6, a second embodiment of this invention will be described. This embodiment of the invention is applied to the formation of memory cells such as a DRAM. FIG. 5 is a plan view of a part of the memory cell, and FIG. 6 is a sectional view cut perpendicular to directions X-Y indicated in FIG. 5.

Figure 6:
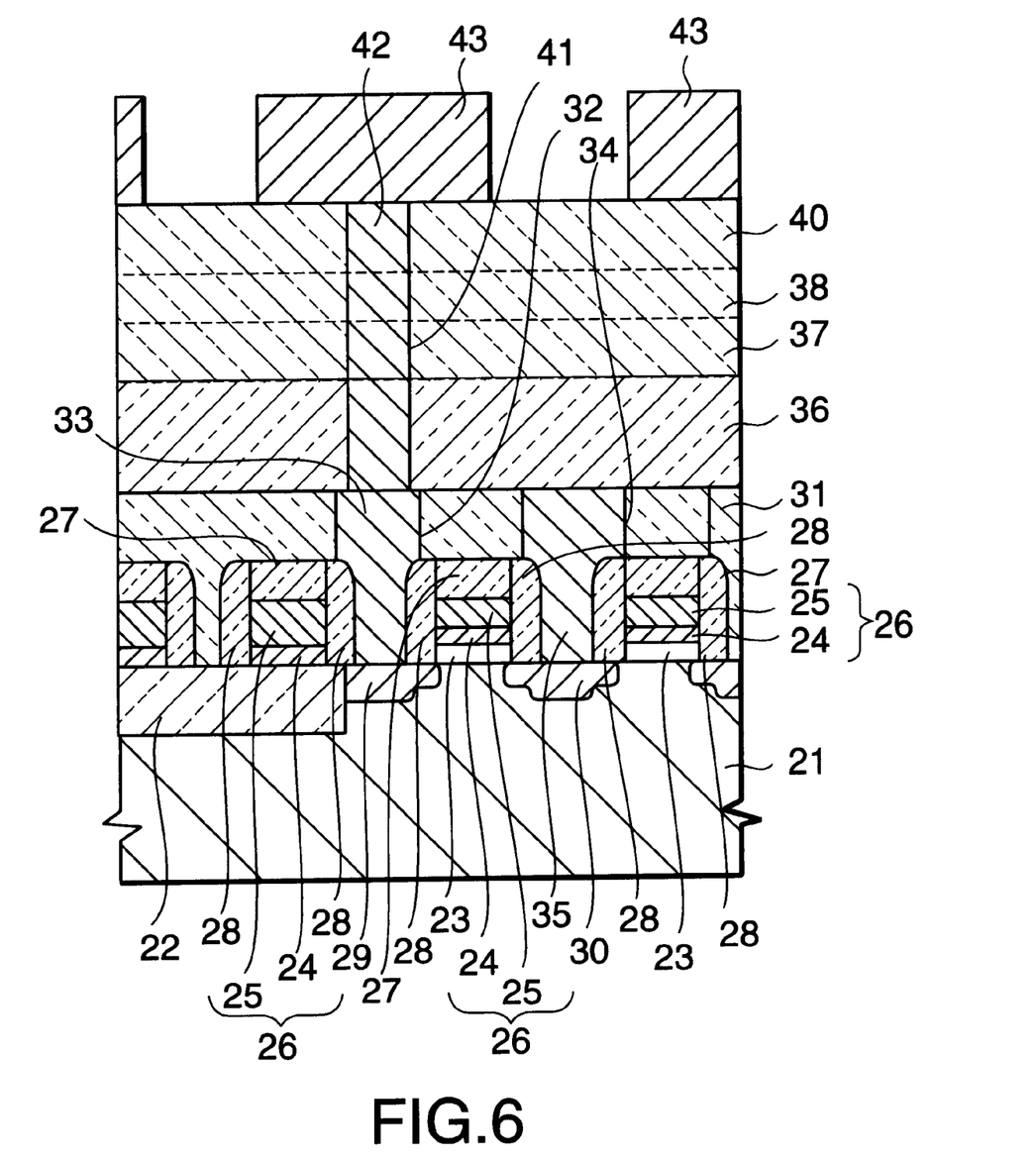
FIG. 6 is a sectional view of the memory cell part for describing the second embodiment of the invention.

As shown in FIG. 6, trench element isolation regions 22 are formed selectively in prescribed regions on a silicon substrate 21. Moreover, gate insulating films 23 are formed on the surface of the silicon substrate 21, and a tungsten nitride (WN) layer 24 and tungsten (W) layer 25 are formed laminated on the gate insulating film 23. The laminated WN layer 24 and the W layer 25 form a word line 26. The word lines 26 are disposed in parallel in memory cells as shown in FIG. 5.

On the word line 26 a nitride film mask 27 is formed in the same way as in the first embodiment. Similarly, on the sidewalls of the word line 26 and the nitride film mask 27 there are formed sidewall nitride film 28. The nitride film mask 27 and the sidewall nitride film 28 serve as the protective films for the word line 26.

Next, as shown in FIG. 6, diffused layers 29 for capacitor and diffused layers 30 for bit lines are formed by ion implantation of impurities and a heat treatment. Then, a lower layer insulating film 31 with thickness of about 400 nm is formed. The lower layer insulating film 31 is formed through deposition of a silicon oxide film by CVD and a subsequent flattening of the silicon oxide film by CMP.

Next, first contact holes 32 for capacitors are formed in self-alignment with the adjacent word lines 26, and contact plugs 33 are filled into the contact holes 32 for capacitors by a method similar to that described in the first embodiment. Similarly, contact holes 34 for bit lines are formed in self-alignment with the adjacent word lines 26, and contact plugs 35 are filled into the contact holes 34 for bit lines. The contact plugs 33 and 35 are composed of polycrystalline silicon containing phosphorus as the impurity.

Next, as shown in FIG. 6, a first layer-insulating film 36 is formed in a manner similar to that in the first embodiment, and first wirings 37 are formed using tungsten. Then, a nitride film mask 38 is formed on the first wirings 37. In this way, the first wirings 37 are disposed in parallel within memory cells as the bit lines s shown in FIG. 5. In addition, sidewall nitride films 39 are formed on the sidewalls of the first wirings 37 as described in the first embodiment. The nitride film mask 38 and the sidewall nitride film 39 serve as protective insulating films for the first wirings 37 being bit lines. Then, a second layer-insulating film 40 is formed on the entire surface as shown in FIG. 6. The first layer-insulating film 36 and the second layer-insulating film 40 are manufactured by deposition of a silicon oxide film by CVD and a subsequent flattening of the silicon oxide film by CMP.

Next, as shown in FIG. 5 and FIG. 6, second contact holes 41 for capacitors are formed in self-alignment with the first wirings 37 being the bit lines. Then, contact plugs 42 are filled in the second contact holes 41 for capacitors. The contact plug 42 is also composed of polycrystalline silicon including phosphorus as an impurity. Here, the contact plugs 42 are connected to the contact plugs 33 that are filled into the first contact holes 32.

Next, as shown in FIG. 5 and FIG. 6, lower electrodes 43 of the capacitors constituting memory cells are formed so as to be connected to the contact plugs 42. The lower electrodes 43 are formed of polycrystalline silicon containing phosphorus as an impurity. Although not shown, capacitor insulating films are formed on the surface of the lower electrodes 43 in this manner, and capacitors of memory cells are formed by forming counter electrodes of the capacitors.

In the second embodiment of the invention, contact holes are formed in self-alignment with the adjacent word lines and in self-alignment with the adjacent bit lines as described in the above. In this invention, the first contact holes 32 for capacitor and the second contact holes 41 for capacitor may be formed in one dry etching process. In this case, the protective insulating film in the periphery of the bit line and the protective insulating film in the periphery of the word line function as etching masks as they are. In this invention, alignment margin required in two times of photolithography in the conventional formation method of the contact holes is made unnecessary. Because of this, the space factor of memory cells such as DRAMs can be reduced significantly. For example, in the mass production of 256 Mb DRAMs with design reference of 0.15 $\mu$m, the areas for the memory cells can be reduced by about 30% from that of the conventional case. In the embodiments according to the present invention, the case of forming the wirings with W or laminated metal of W and WN has been described, but the present invention is not limited to such a case. In addition to the above, the present invention can be applied also to the cases where the wirings are formed using high melting point metals such as molybdenum (Mo), tantalum (Ta) or titanium (Ti), or using a precious metal such as platinum (Pt), or ruhtenium (Ru).

Moreover, in the above embodiments, the present invention has been described assuming that the first dielectric is a silicon oxide film and the second dielectric is a silicon nitride film. However, a Si—O based low dielectric constant film may be used as the first dielectric. As an insulating film, low dielectric constant films of silsesquioxanes such as hydrogen silsesquioxane, methyl silsesquioxane, methylated hydrogen silsesquioxane or fluorinated silsesquioxane may be mentioned.

Moreover, as the second dielectric a silicon oxynitride (SiON) film or an alumina film, other than the silicon nitride film, may be employed.

Furthermore, the present invention is not limited to the above embodiment, and embodiments may be appropriately modified within the scope of the technical concept of the invention.

As described in the above, the gist of the method of manufacturing a semiconductor device according to the present invention includes a step of forming a first layer-insulating film to be adhered to a diffused layer formed on the surface of a semiconductor substrate or to a lower wiring formed on the semiconductor substrate using a first dielectric, a step of disposing mutually parallel upper wirings on the first layer-insulating film, and forming a protective insulating film of a second dielectric having etching rate smaller than that of the first dielectric on the top face and side faces of the upper wirings, and a step of forming a contact hole penetrating the first layer-insulating film and reaching the diffused layer or the lower wiring by a dry etching that uses the protective insulating film as a part of an etching mask.

Because of this, in the present invention, in forming contact holes between parallel upper wirings, there is absolutely no need for securing marginal regions by anticipating a deviation in mask alignment that is required in the conventional technique, so that the wiring pitch in the multilayer structure can be enhanced. This facilitates greatly the attainment of higher integration or higher density of the semiconductor devices. Moreover, the method of formation of the contact holes is simple and a high yield in the manufacture of the semiconductor devices can be secured, so that it is readily applicable to the mass production of the semiconductor devices.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A method of manufacturing a semiconductor device comprising:

forming a first layer-insulating film to be adhered to a diffused layer formed on the surface of a semiconductor substrate or to a lower wiring formed on the semiconductor substrate by using a first dielectric;

disposing mutually parallel upper wirings on said first layer-insulating film and forming a protective insulating film including a second dielectric having a smaller etching rate than that of said first dielectric on the top face and on the side faces of said upper wirings; and forming a contact hole that penetrates said first layer-insulating film and reaches said diffused layer or lower wiring by a dry etching that uses said protective insulating film as a part of an etching mask, wherein said disposing mutually parallel upper wirings comprises forming a metal film, a first nitride film portion of said protective insulating film at said top face, and an oxide film in this order on said first layer-insulating film and subsequently removing said oxide film with a dry etching process.

2. The method of claim/wherein said dry etching process comprises an etch rate of said oxide film to an etch rate of said metal film of about 1 to 2.

3. The method of claim 1, wherein said protective insulating film comprises a second nitride film portion of said protective insulating film at said side faces of said upper wirings.

4. The method of claim 1, wherein said first nitride film portion and said second nitride film portion of said protective insulating film each comprise an etching mask in said forming said contact hole.

5. The method of claim 1, further comprising:

after forming said contact hole, subjecting said semiconductor device to diluted hydrofluoric acid solution (DHF).

6. The method of claim 1, wherein said dry etching process comprises one of inductively coupled plasma and microwave excitation.

7. A method of manufacturing a semiconductor device comprising:

forming a first layer-insulating film to be adhered to a diffused layer formed on the surface of a semiconductor substrate or to a lower wiring formed on the semiconductor substrate by using a first dielectric;

disposing mutually parallel upper wirings on said first layer-insulating film and forming a protective insulating film including a second dielectric having a smaller etching rate than that of said first dielectric on the top face and on the side faces of said upper wirings;

forming a second layer-insulating film using said first dielectric so as to cover said protective insulating film on said first layer-insulating film; and forming on said second layer-insulating film a resist film having a contact hole pattern, and letting the contact hole penetrate said second layer-insulating film by a dry etching using said resist film as an etching mask, and subsequently to that, forming a contact hole reaching said diffused layer or lower wiring by a dry etching of said first layer-insulating film using said protective insulating film as an etching mask, wherein said disposing mutually parallel upper wirings comprises forming a metal film, a first nitride film portion of said protective insulating film at said top face, and an oxide film in this order on said first layer-insulating film and subsequently removing said oxide film with a dry etching process.

8. The method of claim 7, wherein said dry etching process comprises an etch rate of said oxide film to an etch rate of said metal film of about 1 to 2.

9. The method of claim 7, wherein said protective insulating film comprises a second nitride film portion of said protective insulating film at said side faces of said upper wirings.

10. The method of claim 9, wherein said first nitride, film portion and said second nitride film portion of said protective insulating film each comprise an etching mask in said forming said contact hole.

11. The method of claim 7, further comprising:

after forming said contact hole, subjecting said semiconductor device to diluted hydrofluoric acid solution (DHF).

12. A method of manufacturing a semiconductor device comprising:

forming a first layer-insulating film to be adhered to a diffused layer formed on the surface of a semiconductor substrate or to a lower wiring formed on the semiconductor substrate by using a silicon oxide film;

forming by lamination a high melting point metal film, a first silicon nitride film and a silicon oxide film in this order on said first layer-insulating film;

processing said silicon oxide film and first silicon nitride film to be laminated into a wiring pattern, forming upper wirings by a dry etching of said high melting point metal film using the silicon oxide film and the silicon nitride film processed into said wiring pattern as an etching mask, and at the same time removing the silicon oxide film processed into said wiring pattern;

depositing on the entire surface a second silicon nitride film that covers said first silicon nitride film processed into said wiring pattern, side faces of said upper wirings and exposed faces of said first layer-insulating film;

forming a sidewall nitride film on side faces of the first silicon nitride film processed into said wiring pattern and said upper wirings by an anisotropic dry etching of the entire surface of said second silicon nitride film; and forming a contact hole that penetrates said first layer-insulating film and reaches said diffused layer or lower wiring by a dry etching using the first silicon nitride film processed into said wiring pattern and said sidewall nitride film as a part of an etching mask.

13. The method of manufacturing a semiconductor device as claimed in claim 12, wherein said high melting point metal is tungsten (W) or a laminated metal of tungsten and tungsten nitride (W/WN), and the etching gas for the dry etching that uses the silicon oxide film and the first silicon nitride film processed into said wiring pattern as the etching mask is a gas obtained by adding $CF_4$ gas or $C_4F_8$ gas to a mixed gas of $SF_6$ and $N_2$ and $Cl_2$ and is excited with a plasma.

14. The method of manufacturing a semiconductor device as claimed in claim 12, wherein attached substances formed after the dry etching process of said high melting point metal film or the dry etching process for the formation of the contact hole are removed using a chemical liquid containing hydrofluoric acid.

15. The method of manufacturing a semiconductor device as claimed in claim 12, wherein the deposition of said second silicon nitride film is performed by a thermal CVD which uses a mixed gas of $NH_3$ and $SiH_4$ as a reaction gas.

16. A method of manufacturing a semiconductor device comprising:

forming a first layer-insulating film to be adhered to a diffused layer formed on the surface of a semiconductor substrate or to a lower wiring formed on the semiconductor substrate by using a silicon oxide film;

forming by lamination a high melting point metal film, a first silicon nitride film and a silicon oxide film in this order on said first layer-insulating film;

processing said silicon oxide film and first silicon nitride film to be laminated into a wiring pattern, forming upper wirings by processing said high melting point metal film by a dry etching that uses the silicon oxide film and the first silicon nitride film processed into said wiring pattern as an etching mask, and at the same time removing the silicon oxide film processed into said wiring pattern;

depositing on the entire surface a second silicon nitride film that covers the first silicon nitride film processed into said wiring pattern, the side faces of said upper wirings and exposed faces of said first layer-insulating film;

forming a sidewall nitride film on the side faces of the first silicon nitride film processed into said wiring pattern and said upper wirings by an etch-back of said second silicon nitride film;

forming a second layer insulating film using a silicon oxide film so as to over the first silicon nitride film processed into said wiring pattern being on said first layer-insulating film and said sidewall nitride film; and forming a resist film having a contact hole pattern on said second layer-insulating film, and forming a contact hole by letting the contact hole penetrate said second layer-insulating film by a dry etching using said resist film as an etching mask, and subsequently to that, by a dry etching of said first layer-insulating film using the first silicon nitride film processed into said wiring pattern and said sidewall nitride film as an etching mask.

17. The method of manufacturing a semiconductor device as claimed in claim 16, wherein said high melting point metal is tungsten (W) or a laminated metal of tungsten and tungsten nitride (W/WN), and the etching gas for the dry etching that uses the silicon oxide film and the first silicon nitride film processed into said wiring pattern as the etching mask is a gas obtained by adding $CF_4$ gas or $C_4F_8$ gas to a mixed gas of $SF_6$ and $N_2$ and $Cl_2$ and is excited with a plasma.

18. The method of manufacturing a semiconductor device as claimed in claim 16, wherein attached substances formed after the dry etching process of said high melting point metal film or the dry etching process for the formation of the contact hole are removed using a chemical liquid containing hydrofluoric acid.

19. The method of manufacturing a semiconductor device as claimed in claim 16, wherein the deposition of said second silicon nitride film is performed by a thermal CVD which uses a mixed gas of $NH_3$ and $SiH_4$ as a reaction gas.

20. A method of manufacturing a semiconductor device comprising a memory cell including one insulated gate field effect transistor and one capacitor and a layer insulating film formed of a first dielectric, comprising:

forming a word line and a diffused layer for a memory cell on the surface of a semiconductor substrate, then forming a protective insulating film using a second dielectric having an etching rate smaller than that of said first dielectric on the top face and side faces of said word line;

forming said layer insulating film using the first dielectric on said word line and on said diffused layer;

disposing a bit line on said layer insulating film and forming a protective insulating film on said bit line using said second dielectric;

forming a contact hole that penetrates said layer insulating film and reaches said diffused layer by a dry etching that uses said protective insulating film in the periphery of said bit line and the protective insulating film in the periphery of said word line as etching masks; and forming a lower electrode of said capacitor that is connected to said diffused layer via said contact hole.

* * * * *